(12) United States Patent
Larsson

(10) Patent No.: US 6,192,577 B1
(45) Date of Patent: Feb. 27, 2001

(54) METHOD FOR SHIELDING OF ELECTRONICS

(75) Inventor: Anders Larsson, Söderkroksvägen (SE)

(73) Assignee: Telefonaktiebolaget LM Ericsson (SE)

( * ) Notice: Subject to any disclaimer, the term of this patent is extended or adjusted under 35 U.S.C. 154(b) by 0 days.

(21) Appl. No.: 08/954,606

(22) Filed: Oct. 20, 1997

(30) Foreign Application Priority Data

Oct. 28, 1996 (SE) .................................................. 9603931

(51) Int. Cl.$^7$ ....................................................... H05K 3/34
(52) U.S. Cl. .......................... 29/840; 29/841; 174/35 R; 361/816
(58) Field of Search .............................. 29/840, 841, 832, 29/843; 361/424, 380, 399, 816, 818; 174/52.4, 35 R

(56) References Cited

U.S. PATENT DOCUMENTS

| | | | |
|---|---|---|---|
| 4,404,617 | * 9/1983 | Ohyama et al. ..................... 361/424 |
| 4,626,963 | 12/1986 | Speer ................................... 361/424 |
| 4,717,989 | 1/1988 | De Barros et al. .................. 361/424 |
| 4,717,990 | * 1/1988 | Tugcu .................................. 361/424 |
| 4,761,881 | * 8/1988 | Bora et al. ............................ 29/840 |
| 4,838,475 | 6/1989 | Mullins et al. ..................... 228/179 |
| 4,903,169 | * 2/1990 | Kitagawa et al. .................. 361/424 |
| 5,054,193 | * 10/1991 | Ohms et al. ........................... 29/840 |
| 5,153,379 | 10/1992 | Guzuk et al. ......................... 174/35 |
| 5,300,941 | 4/1994 | Hemmie et al. .................... 343/840 |
| 5,323,533 | * 6/1994 | Val ......................................... 29/840 |
| 5,365,410 | 11/1994 | Lonka .................................. 361/816 |
| 5,369,552 | 11/1994 | Barnes et al. ...................... 361/816 |
| 5,388,459 | * 2/1995 | Inoue et al. ........................... 73/517 |
| 5,412,340 | 5/1995 | Tanikoshi ............................. 330/68 |
| 5,442,521 | 8/1995 | Hirvonen et al. .................. 361/800 |
| 5,500,949 | 3/1996 | Saito .................................... 395/427 |
| 5,557,508 | * 9/1996 | Sato et al. ........................... 361/818 |
| 5,880,403 | * 3/1999 | Czajkowski et al. ............. 174/35 R |
| 5,946,199 | * 8/1999 | Matsuzaki ........................... 361/818 |

FOREIGN PATENT DOCUMENTS

| | | |
|---|---|---|
| 0407072 | 1/1991 | (EP) . |
| 0594041 | 4/1994 | (EP) . |
| 0674476 | 9/1995 | (EP) . |
| 2226187A | 6/1990 | (GB) . |
| 7-116830 | 5/1995 | (JP) . |
| 7-142906 | 6/1995 | (JP) . |
| 7-212060 | 8/1995 | (JP) . |
| 7-283571 | 10/1995 | (JP) . |
| 7-302990 | 11/1995 | (JP) . |
| 8-111580 | 4/1996 | (JP) . |
| 8-236219 | 9/1996 | (JP) . |
| 1478388 | 1/1991 | (SU) . |

\* cited by examiner

*Primary Examiner*—Lee Young
*Assistant Examiner*—Minh Trinh
(74) *Attorney, Agent, or Firm*—Burns, Doane, Swecker & Mathis, L.L.P.

(57) ABSTRACT

In a method for shielding electronics, a plurality of components to be shielded are arranged on a part of an assembly base to be shielded, each of the plurality of components having a first side including a first contact surface connectable to a common earth connection of the assembly base, each of the plurality of components further having a second contact surface, the plurality of components being arranged such that, for each of the plurality of components, the first side with the first contact surface faces out toward a periphery of the part of the assembly base. For each of the plurality of components, the first contact surface is connected to the earth connection. The plurality of components are shielded with a shielding device. For each of the plurality of components, the first contact surface is closer to the shielding device than the second contact surface.

8 Claims, 5 Drawing Sheets

METHOD FOR SHIELDING OF ELECTRONICS

TECHNICAL FIELD

The present invention relates to an apparatus and a method for shielding electronic components on an assembly base.

STATE OF THE ART

According to the prior art, electronic components, also called components, attached to an assembly base in e.g. radio receivers, television apparatuses, com-puters, transceivers (transmitters) and telephones in many cases need to be shielded from the environment in order to prevent undesirable radiation from the electronic compo-nents. Examples of such radiation can be radio frequency radiation, so-called RF-radiation (Radio Frequency radiation). Electronic components can also in certain cases be shielded in order to be protected against the influence of e.g. static electricity, so-called ESD (Electro Static Discharge).

Examples of electronic components are resistors, capacitors, coils or transistors, and integrated circuits. The assembly base ban be printed circuit board.

Such electronic components comprise two or more contact connections, so-called poles. The function of the poles is different for different components. For example, a pole on a component can be connected to a common earth connection on the assembly base.

A method according to the prior art for shielding electronic components on an assembly base is to mount a capsule, a so-called shielding box, around the electronic components which need to be shielded. The shielding boxes are manufactured of a suitable solderable metal.

The shielding boxes can be mounted automatically to the assembly base over the intended electronic components with a so-called "pick and place" machine. Such a machine is a robot which picks up components, rolled up on a roll or placed on a tray, from the roll resp. the tray, and places the components in the desired place on the assembly base.

A disadvantage of the method above is that the shielding boxes can be displaced or placed askew during the automatic mounting of the box over the components, whereby the shielding box can come into contact with the components which are placed near to its inner side. This can led to that the components placed near to the inner surfaces of the shielding boxes are shortcircuited against its inner side.

Different methods are used to fix the shielding boxes to the assembly base, for example with the help of bolted or clamping joints.

A disadvantage of screwed or clamped joints is that they can be complicated to manipulate and that they are expensive.

Another method is to solder the shielding box onto the assembly base in a so-called surface mounting process, also called SMD-process (Surface Mount Device-process).

The SMD-process is a process where components are soldered to contact surfaces on the assembly base. The components are positioned with a robot on the desired contact surfaces, which surfaces are provided with solder. Subsequently, the assembly base is heated in an oven, whereby the solder melts which leads to the components being fixed to the base.

A disadvantage when shielding boxes are soldered to the assembly base is that the solder, with which the shielding boxes are fixed to the assembly base, can come into contact with a component situated near the inner side of the shielding box, whereby the component is shortcircuited with the solder.

In order to prevent shortcircuiting as above, according to the prior art the shielding box is made sufficiently large so that a safe distance is obtained between the inner surfaces of the shielding box and the electronic components enclosed in the shielding box. A disadvantage is that the box thereby takes up a large place on the assembly base.

Another method according to the prior art for obtaining a reasonably exact positioning of the shielding box on the assembly base is to use guide holes in the assembly base and guide pins on the shielding box. A disadvantage of this method is that it requires a great precision during the positioning of the box on the assembly base, and furthermore the opposite side of the assembly base cannot be used for mounting of components in the case that the guide holes go all the way through.

In the patent document GB A 2 226 187 a shield with walls is described, which walls are placed in an arrangement on a circuit board over the electronic components which are to be shielded. The device comprises projecting elastic finger-shaped supports which are arranged as a U-shaped channel.

In the patent document JP A 07-142906 a shield is described with projecting brackets which brackets are mounted in soldering recesses intended for them in a circuit. The brackets are fixed in the soldering holes by soldering.

DISCLOSURE OF THE INVENTION

A problem which the invention solves is to prevent emissions from electronic components on an assembly base.

Another problem is to prevent shortcircuiting between a shielding unit and the electronic components situated closest to the shielding unit during automatic mounting of the shielding unit over the electronic components on the assembly base. The electronic components can thereby be enclosed in the shielding unit or can be situated outside it.

Yet another problem is to prevent shortcircuiting between the solder with which the shielding unit is fixed to the assembly base, and the electronic components situated closest to the shielding unit.

Yet another problem is to minimize the space which the shielding unit needs on the assembly base in order to shield said electronic components.

An object of the present invention is consequently to, with a reliable and simple method and with a reliable and simple device, shield intended electronic components on an assembly base with a shielding unit, whereby the shielding unit takes up a small place on the assembly base, and to prevent shortcircuiting between the shielding unit respectively the solder with which the shielding unit is fixed to the base, and the enclosed electronic components situated closest to the shielding unit, when the shielding unit is automatically mounted on the assembly base.

Another object of the present invention is to prevent shortcircuiting between the shielding unit respectively the solder, and the electronic components situated closest to the shielding unit, which electronic components are mounted on the assembly base outside the shielding unit when the shielding unit is automatically mounted onto the assembly base.

In order to bring about this, the present invention uses the placement of a certain number of the mounted components enclosed in the shielding unit, which components have a pole which can be connected to a common earth connection on the assembly base. These poles are then turned towards an inner side surface of the shielding unit and connected to said earth connection.

According to an advantageous embodiment of the method, said enclosed compo-ents are placed at least a certain distance from the other components enclosed in the shielding unit.

According to a modified method, a certain number of possible components, situated outside the shielding unit which comprise a pole connectable to said earth connection, can be turned with their respective poles towards an outer side surface of the shielding unit, wherein these poles are connected to said earth connection.

In more detail, the method is arranged so that the intended electronic components on the assembly base are shielded with the shielding unit. A certain number of the shielded electronic components, which comprise a pole connectable to said earth connection, are laced before said shielding on the assembly base so that these poles are facing out towards the periphery of he part of the assembly base which is to be shielded, the so-called shielded part of the assembly base, wherein they are connected to said earth connection.

The method according to the invention is not limited to connecting said poles to an earth connection but a constant potential V≠0 can also be used, wherein the shielding unit and said poles are connected to the constant potential V.

Said shielded electrical components are also placed on the assembly base so that the side of the components which faces towards the periphery of the shielded part of the assembly base, is paced at least a certain distance from the other electronic components enclosed in the shielding unit.

According to a modified method a certain number of possible components situated outside the shielding unit which comprise a pole connectable to said earth connection, can be placed on the assembly base so that these poles are facing towards the periphery of the shielded part of the assembly base, wherein these poles are connected to said earth connection.

Said electronic components situated outside the shielding unit can be placed on the assembly base so that the side of the components which is facing towards the periphery of the shielded part of the assembly base, is placed at least a certain distance from the other electronic components situated outside the shielding unit on the assembly base.

According to a further modified method the shielded electronic components according to the above, before said shielding on the assembly base, are placed so that they are situated at least a certain distance from the shielding unit. These components do not need to be connected to an earth connection.

Furthermore, components situated outside the shielding unit are placed in the same way as described according to the first modified method. The distance between the shielded electronic components and the shielding unit is greater than the distance between the closest situated components outside the shielding unit and the shielding unit.

A device according to the invention comprises a shielding unit placed over the electronic components on the assembly base which are to be shielded. A certain number of the shielded components which comprise a pole connectable to said earth connection, are arranged on the assembly base so that these poles are facing out towards said inner side surface of the shielding unit, and furthermore these poles are connected to said earth connection.

Similarly to that described above, the device according to the invention is not limited to that said poles are connected to an earth connection but also a constant potential V≠0 can be used, whereby the shielding unit and said poles are connected to the constant potential V.

Said shielded electronic components are also arranged on the assembly base so that the side of the components which is facing towards the inner side surface of the shielding unit, is placed at least a certain distance from the other shielded components.

According to a modified arrangement in accordance with the invention, a certain number of the components situated outside the shielding unit, which components comprise a pole connectable to said earth connection, can possibly be arranged on the assembly base outside the shielding unit so that these poles are facing towards said outer side surface of the shielding unit, and furthermore these poles are connected to said earth connection.

Said electronic components situated outside the shielding unit can also be arranged on the assembly base such that the side of the components facing towards the outer side surface of the shielding unit, is placed at least a certain distance from the other components situated outside the shielding unit on the assembly base.

According to a further modified arrangement, the shielded electronic components according to the above can be arranged on the assembly base such that they are situated at least a certain distance from the shielding unit. These components do not need to be connected to an earth connection.

Further, the components situated outside the shielding unit can be arranged on the assembly base in the same way as described according to the first modified device. The distance between the shielded electronic components and the shielding unit is greater than the distance between the closest situated components outside the shielding unit and the shielding unit.

An advantage of the present invention is that there is room for several electronic component pieces on the assembly base without the risk for the electronic components being shortcircuited against the shielding unit or the solder with which the shielding unit is fixed to the assembly base.

Another advantage is that the shielding unit takes up little place on the assembly base as only a little space is required between the shielding unit and the electronic components situated around the shielding unit.

The invention will now be described more closely with the help of preferred embodiments and with reference to the appended drawings.

PREFERRED EMBODIMENTS

An example of an embodiment of the device according to the invention will be described below in relation to FIGS. 1 and 2, wherein a number of electronic components are desired to be shielded on an assembly base 1.

Figure 1:
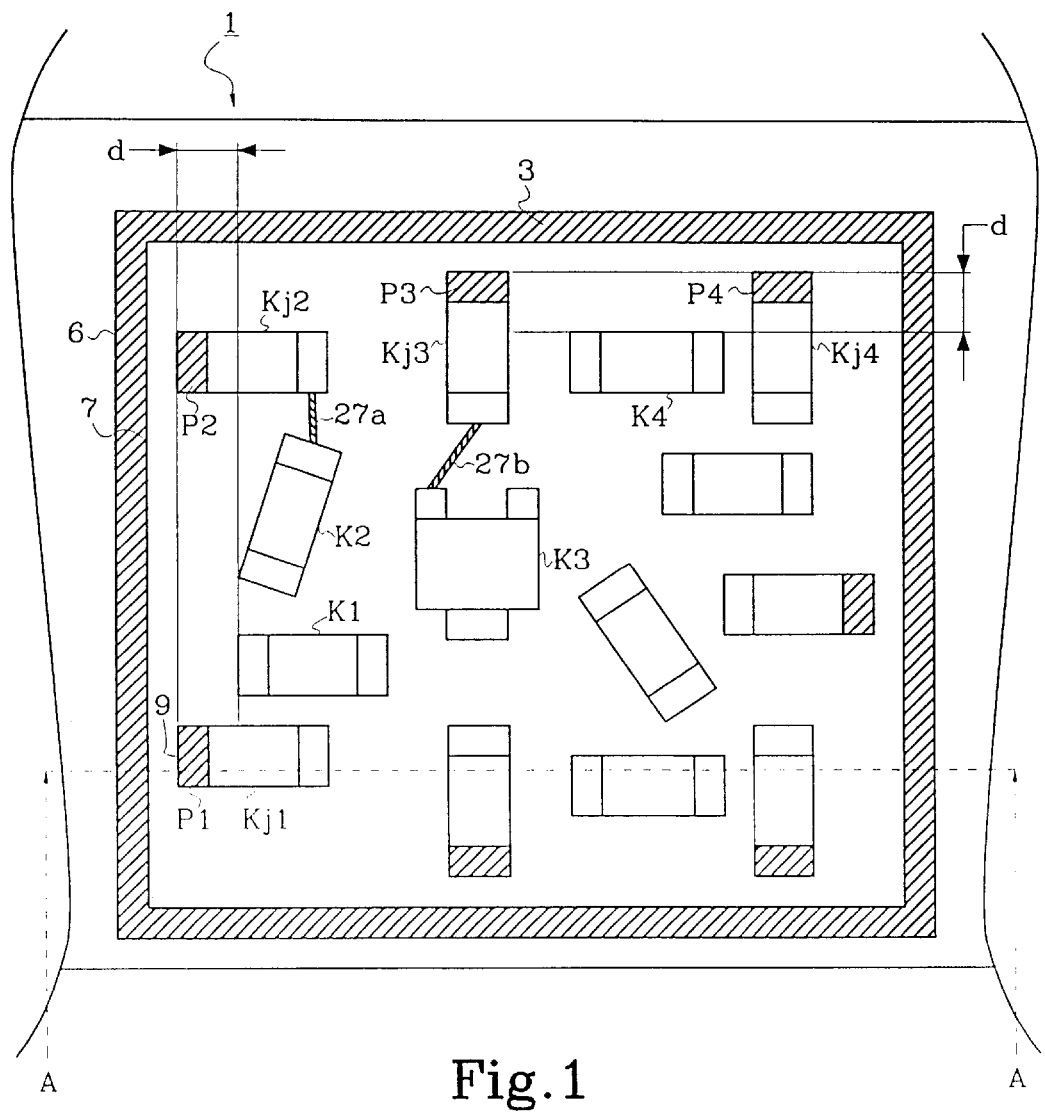
FIG. 1 shows in a view from above a cross-section of a shielding unit mounted over shielded electronic components on a circuit board, according to the inventive method.

FIG. 1 shows a cross-section of a shielding unit in the shape of a rectangular box 3 with an outer and an inner rectangular contour. The base surface of the box is in contact with an assembly base 1, enclosing the shielded electronic components.

The figure also shows two strap conductors 27a, 27b which will be described in more detail below in connection with FIG. 5.

The assembly base 1 is, for example, a circuit board which carries the electronic components.

The shielding unit 3 comprises an outer side surface 6 and an inner side surface 7 with a bottom edge 8 which as well as its bottom base surface is in contact with the circuit board 1. The shielding unit 3 is manufactured in a suitable solderable metal.

The inner side surface 7 and the outer side surface 6 surround the shielded electronic components. The inner side surface 7 is situated closest to the shielded electronic components and the outer side surface 6 is parallel with the inner side surface 7.

The electronic components comprise, for example, resistors, capacitors, coils, transistors, or integrated circuits. Certain of these electronic components have a contact connection, or a so-called pole, which can be connected to a common earth connection on the circuit board 1.

The electronic components in the example described below comprise partly exterior components which are mounted onto the circuit board 1 outside the shielding unit 3, partly outer placed components Kj1, Kj2, Kj3, Kj4 as shown in FIG. 1, and partly other shielded electronic components K1, K2, K3, K4 enclosed by the shielding unit 3. No exterior components and only some of the outer placed components Kj1, Kj2, Kj3, Kj4 and the other shielded electronic components K1, K2, K3, K4 are shown in the figures in order to simplify the illustration of the invention.

The outer placed components Kj1, Kj2, Kj3, Kj4 comprise such a said pole P1, P2, P3, P4 as described above.

Figure 2:
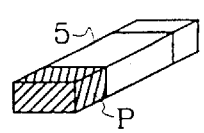
FIG. 2 shows a perspective view of an electronic component according to the prior art.

FIG. 2 shows an electronic component 5 which comprises two poles. One of the poles P can be formed of a bent metal leg which projects out form one end of the electronic component 5, which metal leg can be connected to said earth connection. The pole P can also be formed of melted solder fixed in one end of the electronic component 5, whereby the solder can be connected to said earth connection, or the pole P can be formed of a piece of metal fixed in one end of the electronic component 5, which piece of metal can be connected to said earth connection. The outer placed components Kj1, Kj2, Kj3, Kj4, described above, with their respective poles P1, P2, P3, P4 can each be formed of such an electronic component 5 with pole P.

The electronic components are, according to the invention, consequently arranged on the circuit board 1 in such a way that a certain number of the shielded components, which have said poles P1, P2, P3, P4 which are to be connected to said earth connection, are mounted on the circuit board 1 closest to the inner side surface 7 of the shielding unit. These so-called outer placed components Kj1, Kj2, Kj3, Kj4 are shown in FIG. 1, wherein the poles P1, P2, P3, P4 are facing out towards the inner side surface 7 of the shielding unit, and furthermore, each one of these poles P1, P2, P3, P4 is connected to the common earth connection (not shown in FIG. 1) on the circuit board 1.

The outer placed components Kj1, Kj2, Kj3, Kj4 are also arranged on the circuit board 1 so that a first side 9 of these components, which first side 9 is facing towards the inner side surface 7 of the shielding unit, has at least a distance d>0 from the other shielded electronic components K1, K2, K3, K4 on the circuit board 1.

The size of the distance d varies depending on the field of use for the invention. An example of the size of the distance d is in the order of magnitude of 0.5–1 mm.

FIG. 1, like the figures described below, is for the sake of clarity enlarged in order to more easily illustrate the invention.

According to a modified arrangement in accordance with the invention the exterior components which are situated on the circuit board 1 outside the shielding unit 3 are possibly arranged on the circuit board 1 in such a way that a certain number of the exterior components, which have a pole which can be connected to said earth connection, are mounted on the circuit board 1 closest to the outer side surface 6 of the shielding unit. These components with said poles which are to be connected to said earth connection, are facing towards the outer side surface 6 of the shielding unit, and furthermore, each and all of these poles are connected to the common earth connection on he circuit board 1.

Said exterior components are also arranged on the circuit board 1 so that a first side of these components, which first side is facing towards the outer side surface 6 of the shielding unit, has at least a distance d≠0 from he other exterior components on the circuit board 1.

Figure 3:
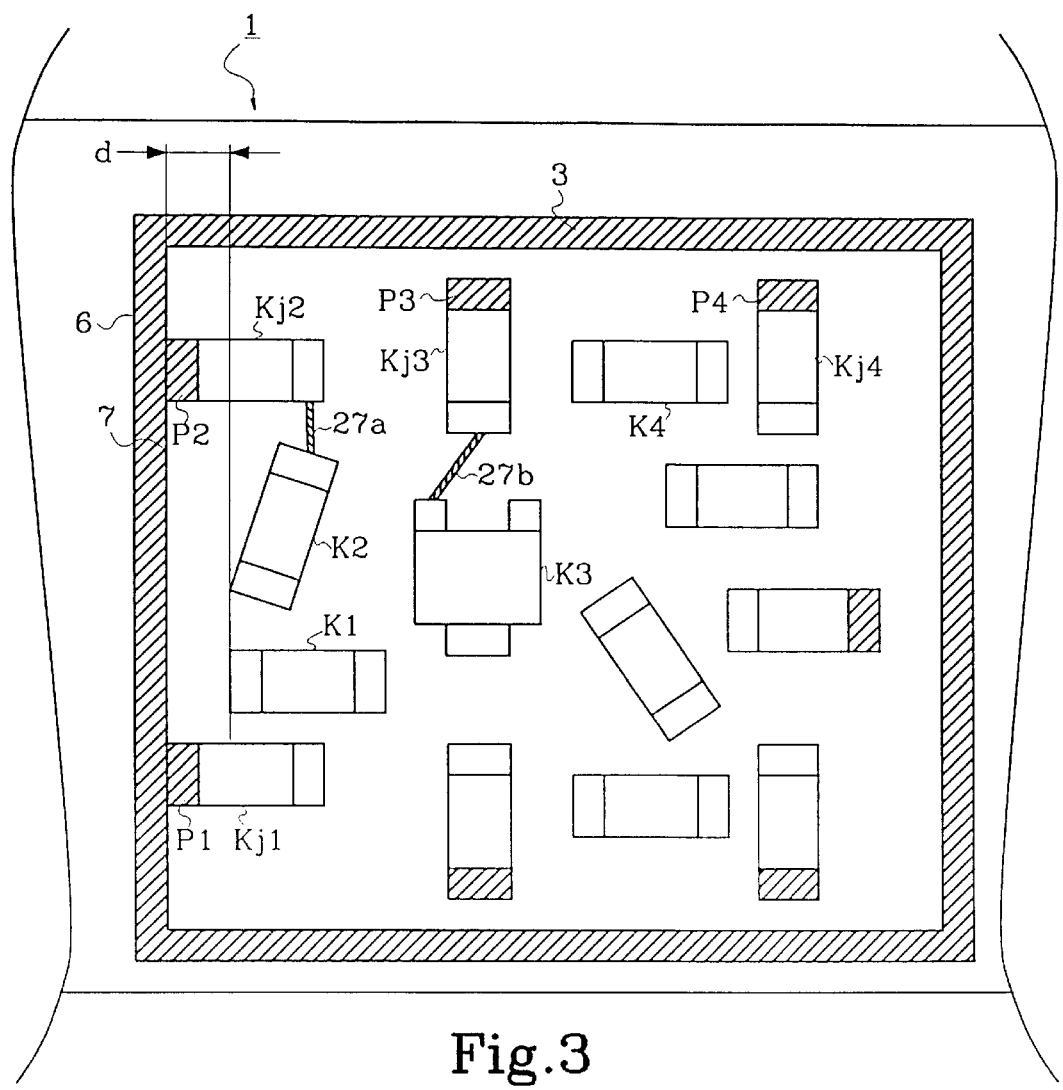
FIG. 3 shows in the same view as FIG. 1 the shielding unit displaced on the circuit board.

An alternative embodiment of the invention in connection with the preceding example and FIG. 3 is described below, wherein the shielding unit 3 is displaced on the circuit board 1 according to the invention.

FIG. 3 shows the shielding unit 3 placed over the shielded electronic components on the circuit board 1, as described above, wherein the inner side surface 7 of the shielding unit is in contact with two of the poles P1, P2 of the outer placed components, which poles P1, P2 are connected to said earth connection according to the previously described example.

The shielding unit 3 is placed on the circuit board 1 so that the inner side surface 7 is positioned at least with the distance d from the other shielded electronic components K1, K2, K3, K4 enclosed in the shielding unit 3.

Through the use of the suggested method, no shortcircuit occurs between the poles P1, P2 and the inner side surface 7 of the shielding unit in the case that these poles P1, P2 are connected to the common earth connection on the circuit board 1.

The distance between the inner side surface 7 of the shielding unit and all of the other shielded electronic components on the circuit board 1 is larger than or equally larger as the distance d, which is evident from FIG. 3.

According to a modified arrangement, in a corresponding manner to that according to the above descried example, no shortcircuit occurs between the exterior components and the outer side surface 6 of the shielding unit, if the outer side surface 6 of the shielding unit is in contact with any of the poles of the exterior components, which poles are connected to said earth connection.

Figure 4:
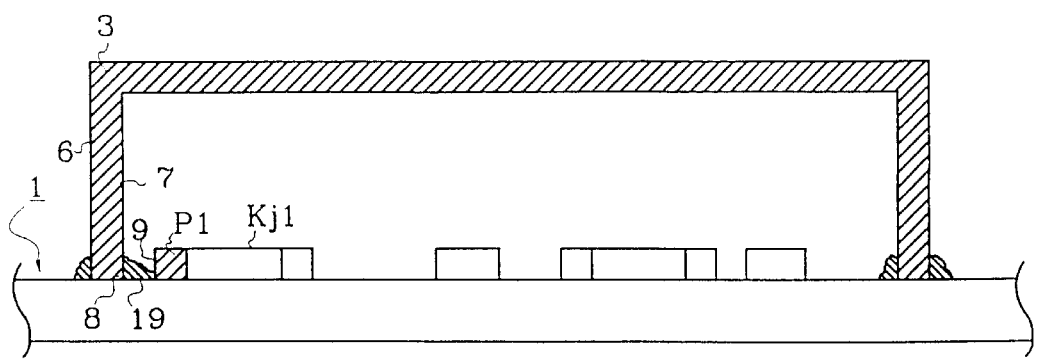
FIG. 4 shows a cross-section A—A of FIG. 1 through the shielding unit and the shielded electronic components according to the invention.

FIG. 4 shows, according to a further alternative embodiment of the invention, a cross-section A—A of FIG. 1, wherein the shielding unit 3 is soldered fast with solder 19 to the circuit board 1, and the shielding unit 3 encloses in accordance with the above the shielded electronic components.

The solder 19 has flowed out on the circuit board 1 around the bottom edge 8 of the shielding unit, whereby the solder 19 is in contact with a pole P1 of an exterior positioned component.

No shortcircuit occurs according to the invention between the pole P1 and the solder 19, since the pole P1 is connected to the common earth connection on the circuit board 1.

According to a modified arrangement in a corresponding manner no shortcircuit occurs between the solder and a pole of an exterior component, which component's pole is connected to the common earth connection on the circuit board 1.

Figure 7:
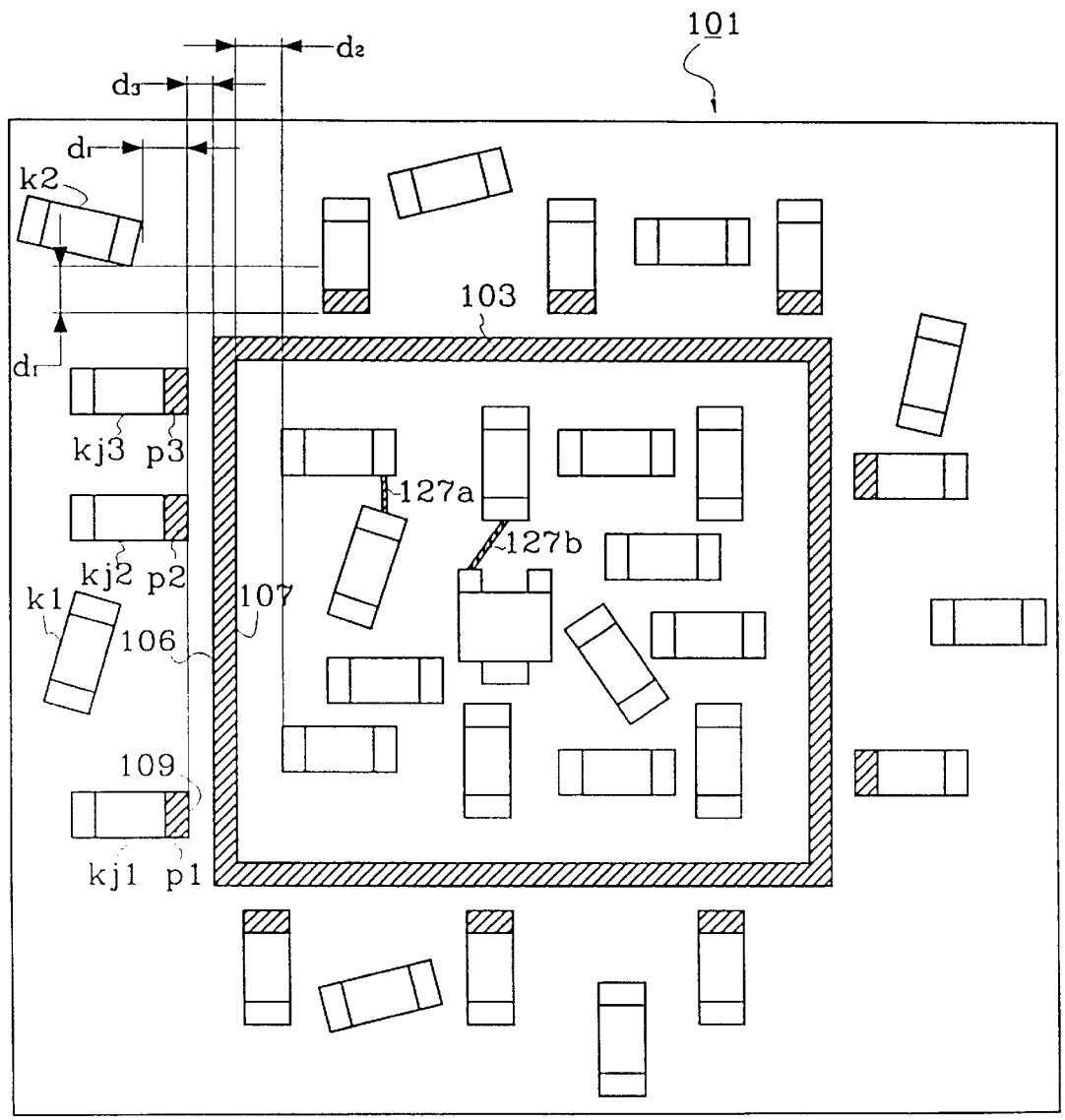
FIG. 7 shows a view from above of a cross-section of a shielding unit and electronic components mounted on a circuit board according to the inventive method.

A further alternative embodiment of the invention in connection to FIG. 7 is described below, wherein a number of electronic components are desired to be shielded on a circuit board 101.

FIG. 7 shows electronic components mounted on the circuit board 101 and a cross-section of a shielding unit 103 mounted on the circuit board 1, wherein the shielding unit 103 encloses a number of shielded electronic components.

The figure also shows strap connectors 127a, 127b, which connect the intended electronic components to each other. Only a few strap connectors 127a, 127b are marked in the figure.

The shielding unit 103 comprises as described in connection with FIG. 1 an outer side surface 106 and an inner side surface 107.

The electronic components in the example described below comprise, on the one hand, exterior components k1, k2, kj1, kj2, kj3, which are mounted on the circuit board 101 outside the shielding unit 103, as is shown in FIG. 7, and on the other hand, shielded electronic components which are enclosed by the shielding unit 103. Only some of the electronic components are marked in the figure in order to facilitate the illustration of the invention.

Certain of the exterior components have a pole p1, p2, p3, which can be connected to a common earth connection on the circuit board 101.

According to the invention the electronic components are arranged on the circuit board 101 in such a way that a certain number of the exterior components which have said poles p1, p2, p3, which are to be connected to said earth connection, are mounted on the circuit board 101 closest to the outer side surface 106 of the shielding unit. These exterior components kj1, kj2, kj3 are shown in FIG. 7, whereby the poles p1, p2, p3 are facing towards the outer side surface 106 of the shielding unit, and furthermore, each and all of these poles p1, p2, p3 are connected to the common earth connection on the circuit board 101.

Said exterior components kj1, kj2, kj3 are also arranged on the circuit board 101 so that a first side 109 of these components, which first side 109 is facing towards the outer side surface 106 of the shielding unit, has at least a distance $d_1 > 0$ from the other exterior components k1, k2 on the circuit board 101.

The shielded electronic components are arranged on the circuit board 101 so that they are situated at least a distance $d_2 > 0$ from the inner side surface 107 of the shielding unit. This distance $d_2$ is greater than the distance $d_3$ between the outer side surface 106 of the shielding unit and the exterior components kj1, kj2, kj3, which are closest situated outside the shielding unit 103. See also FIG. 7. These components do not need to be connected to an earth connection.

The shielding unit 103 can through the use of this device according to the invention only come into contact with the closest situated exterior components kj1, kj2, kj3 during skewed mounting of the shielding nit 103 on the circuit board 101. When these poles p1, p2, p3 of the components, which are facing towards the outer side surface 106 of the shielding unit, are connected to said earth connection, no shortcircuiting occurs between the shielding unit 103 and these components.

In the following example a method according to the invention is described for, in a reliable way, mounting the shielding unit 3 comprising the outer side surface 106 and the inner side surface 7 with the bottom edge 8 on the circuit board 1, according to the above described example, in connection to the above described FIG. 1 and FIGS. 5–6.

Figure 5:
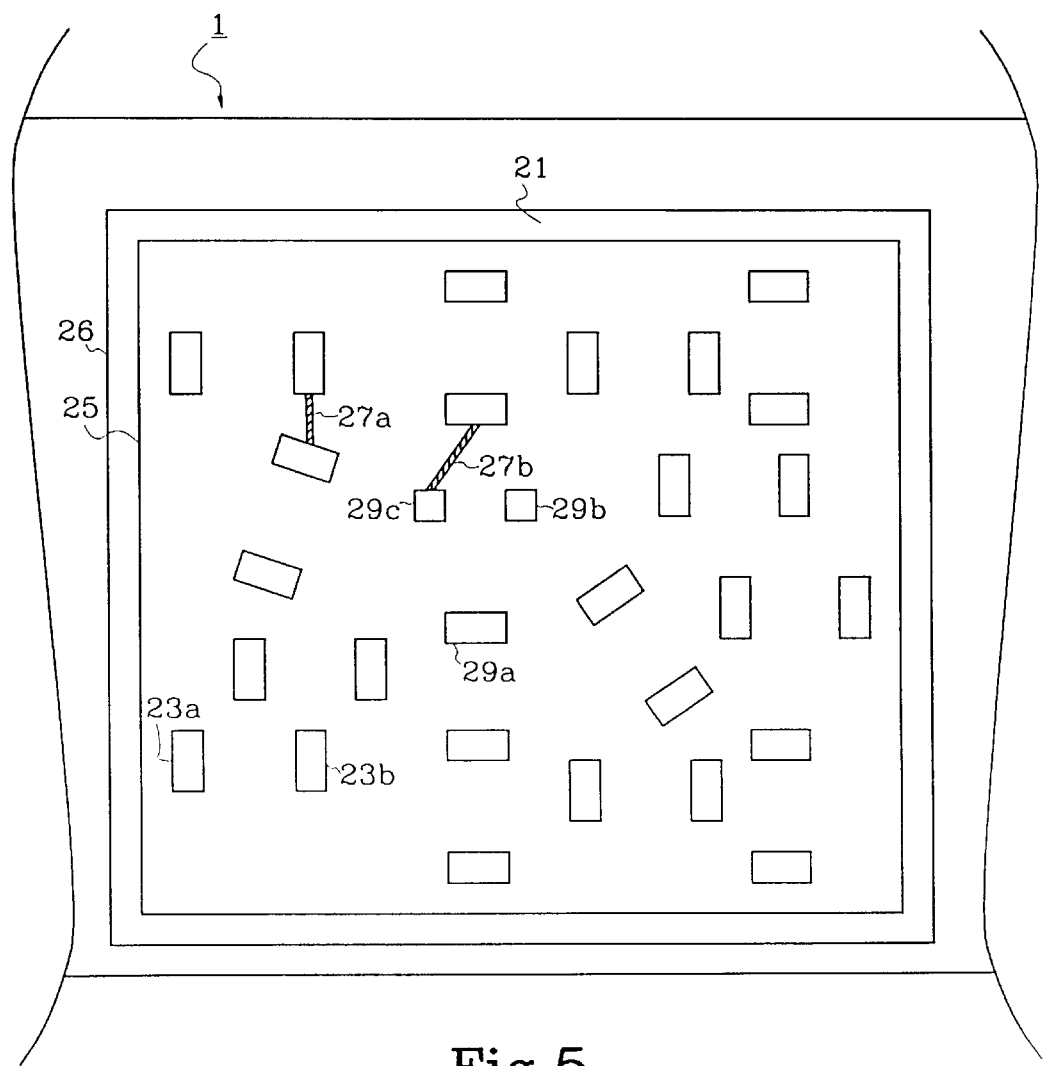
FIG. 5 shows a schematic view from above of the circuit board before the mounting of components according to the inventive method.

The circuit board 1 without mounted electronic components is shown from above in FIG. 5, wherein the circuit board 1 comprises a number of connection surfaces, a screening pattern 21 and strap conductors 27a, 27b. The connection surfaces, screening pattern 21 and the strep conductors 27a, 27b are etched out of an electrically conducting material, such as copper, from the circuit board 1, during the manufacturing of the circuit board 1.

The connection surfaces are surfaces to which the poles of the electronic components are mounted on the circuit board 1, and the connection surfaces are connected to each other via the strap conductors 27a, 27b. Only a few strap condutors 27a, 27b are indicated in FIG. 5.

In FIG. 5 three connection surfaces 29a, 29b, 29c are shown, wherein each connection surface is intended to be connected to one pole of an electronic component which comprises three poles. Two other connection surfaces 23a, 23b are shown in the figure, where each connection surface is intended to be connected to a pole of an electronic component comprising two poles.

The screening pattern 21 is a pattern which indicates the contours of the region where the shielding unit 3 is to be placed on the circuit board 1. The screening pattern 21 surrounds the connection surface to which the shielded components are to be connected.

The screening pattern 21 comprises a frame, which frame comprises a first frame edge 25 parallel with a second frame edge 26. The first frame edge 25 is situated closest to said connection surfaces.

Figure 6:
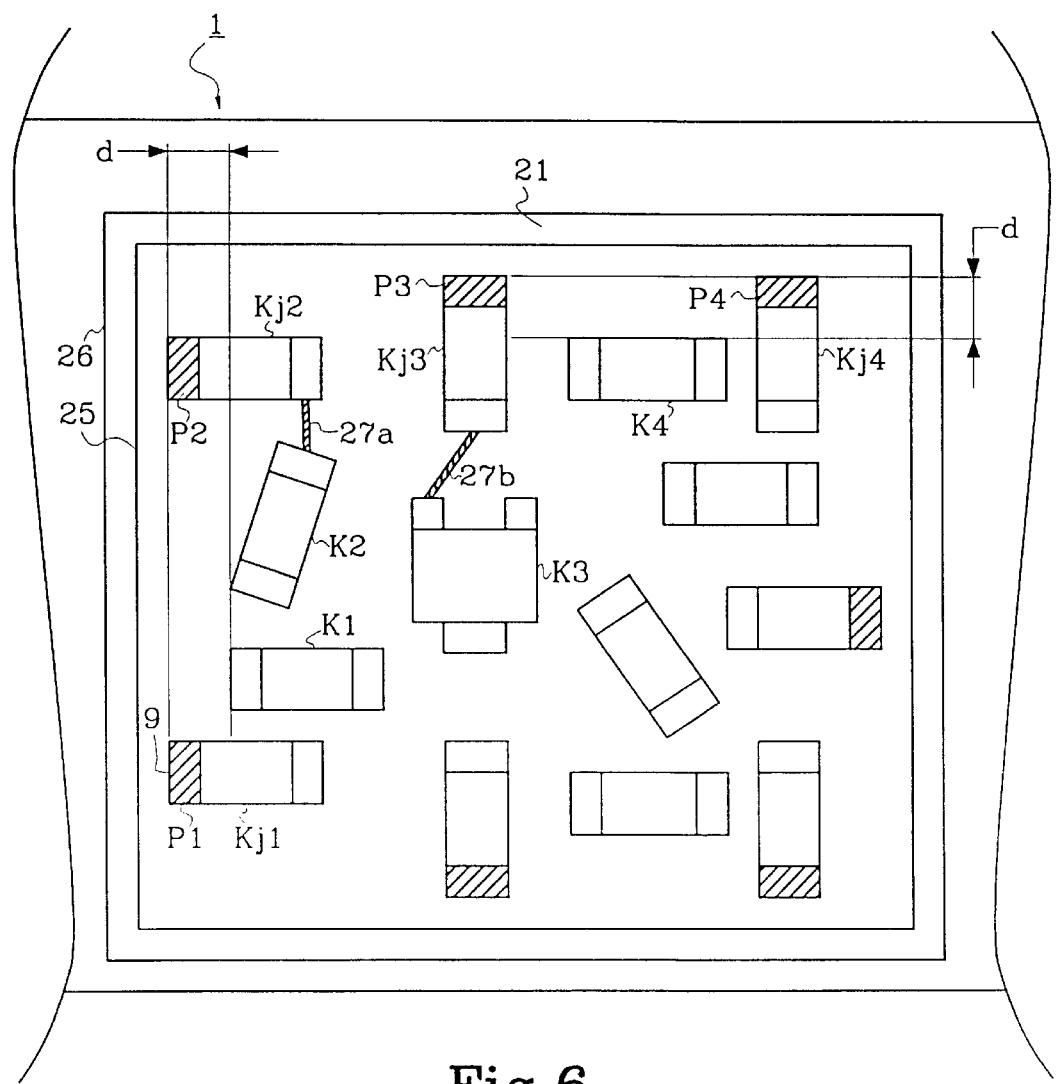
FIG. 6 shows a schematic view from above of the circuit board with electronic components mounted according to the invention.

The first step in the method is to mount the electronic components onto the connection surfaces on the circuit board 1, see also FIG. 6. The same reference numbers for the constituent units as used in FIG. 1 have been retained in FIG. 6. No exterior components which have been described above, are shown in the figure.

The outer placed components Kj1, Kj2, Kj3, Kj4, which have been described above, on the circuit board 1 are the electronic components which are mounted on the circuit board 1 closest to the first frame edge 25 of the screening pattern.

The outer placed component Kj1 is mounted with the pole P1 onto the connection surface 23a, and with the opposite pole onto the connection surface 23b. The component K3, which comprises three poles, is connected with each pole on the connection surfaces 29a, 29b, 29c.

The outer placed components Kj1, Kj2, Kj3, Kj4 are mounted according to the invention onto the connection surfaces on the circuit board 1 with the poles P1, P2, P3, P4 facing out towards the first frame edge 25, see also the figure, whereby these poles P1, P2, P3, P4 are connected to said earth connection.

The outer placed components Kj1, Kj2, Kj3, Kj4 are mounted also onto the connection surfaces so that a first side 9 of these components, which first side 9 is facing towards the first frame edge 25 of the screening pattern, is placed at least a distance d>0 from the other shielded electronic components K1, K2, K3, K4 on the circuit board 1, which other electronic components K1, K2, K3, K4 are surrounded by the screening pattern 21. See also FIG. 6.

The external components on the circuit board 1 are possible electronic components which are mounted on the circuit board 1 outside the screening pattern 21.

According to a modified method, a number of the external components which have a pole which can be connected to said earth connection, are mounted according to the invention onto the intended connection surfaces on the circuit board 1 with said poles facing towards the second frame edge 26, whereby these poles are connected to said earth connection.

Said external components can also be mounted onto the connection surfaces so that a first side of the components, which first side is facing towards the second frame edge 26 of the screening pattern, is placed at least a distance d>0 from the other outside electronic components on the circuit board 1.

Different methods can be used to mount the electronic components onto the connection surfaces on the circuit board 1, e.g. soldering or gluing. A surface mounting process, also known as SMD-process, can be used for soldering of electronic components to the connection surfaces. The SMD-process has been described in more detail above.

The next step in the method according to the invention is to mount the shielding unit 3 to the screening pattern 21 on the circuit board 1. This can, for example, be performed with the above descried surface mounting process, the SMD-process.

Solder is applied to the screening pattern 21 on the circuit board 1. The method which is used to apply the solder to the screening pattern 21 is called a screen-printing method.

Thereafter, the shielding unit 3 is automatically mounted with the lower edge 8 on the above applied solder with the above described "pick and place" machine.

Finally, the circuit board 1 is heated in an oven, as described above, whereby the solder melts and the shielding unit 3 is fixed to the circuit board 1. A cross-section of the shielding unit 3 mounted over the shielded electronic components is shown in FIG. 1.

A further modified method according to the invention, in order to, in a reliable way, mount the shielding unit 103, comprising the outer side surface 106 and the inner side surface 107, on the circuit board 101, is described below in connection with the preceding example and the above described FIG. 7.

The circuit board 101 comprises, as mentioned according to the previous example, connection surfaces and the screen pattern. Similarly, the screening pattern comprises the first frame edge and the second frame edge.

The method is started by the electronic components being mounted onto the connection surfaces on the circuit board 101.

A number of the external components, which have a pole p1, p2, p3, which is to be connected to said earth connection, are mounted according to the invention onto the connection surfaces outside the screening pattern on the circuit board 1 closest to the second frame edge of the screening pattern and with the poles p1, p2, p3 facing towards the second frame edge, wherein these poles p1, p2, p3 are connected to said earth connection.

Said external components kj1, kj2, kj3 are also mounted onto the connection surfaces so that the first side 109 of these components, which first side is facing towards the second frame edge of the screening pattern, is placed at least a distance $d_1$>0 from the other outside components k1, k2 on the circuit board 101.

Thereafter, the shielded electronic components are mounted according to the invention onto the intended connection surfaces inside the screening pattern on the circuit board 1 so that they are situated at least a distance $d_2$>0 from the first frame edge, wherein the distance $d_2$ is greater than the distance $d_3$, between the second frame edge and the external components kj1, kj2, kj3, which are situated closest to the second frame edge. Thesecomponents do not need to be connected to an earth connection.

Finally, the shielding unit 103 is mounted onto the screening pattern on the circuit board 101 in the same way as described according to the previous example. See also FIG. 7.

Even other methods can be used in order to solder the shielding unit 3,103 to the screening pattern 21, e.g. manual soldering, robot soldering or laser soldering.

I claim:

1. A method for shielding electronics, comprising the steps of:

arranging a plurality of components to be shielded on a part of an assembly base to be shielded, each of the plurality of components having a first side including a first contact surface connectable to a common earth connection of the assembly base, each of the plurality of components further having a second contact surface, the plurality of components being arranged such that, for each of the plurality of components, the first side with the first contact surface faces out toward a periphery of the part of the assembly base;

for each of the plurality of components, connecting the first contact surface directly to the earth connection;

shielding the plurality of components with a shielding device, wherein, for each of the plurality of components, the first contact surface is closer to the shielding device than the second contact surface.

2. The method according to claim 1, wherein, for each of the plurality of components, the first side of the component is disposed at a predetermined minimum distance from any other one of the plurality of components.

3. The method according to claim 2, wherein one or more additional components, each of the additional components having a first contact surface connectable to the earth connection, are disposed outside the part of the assembly base, the method comprising the further steps of, for each of the additional components, connecting the first contact surface to the earth connection and, for each of the additional components, arranging the additional component such that its first contact surface faces toward the periphery of the part of the assembly base.

4. The method according to claim 3, wherein each of the plurality of additional components has a first side that is disposed at a second predetermined minimum distance from any other one of the plurality of components and the plurality of additional components.

5. The method according to claim 4, wherein the step of shielding the plurality of components by the shielding device includes soldering the shielding device to the assembly base.

6. A method for shielding components on an assembly base, comprising the steps of: arranging a plurality of first components to be shielded on a part of an assembly base to be shielded;

arranging a plurality of second components outside the part of the assembly base which is to be shielded, each of the second components of the plurality of second components having a contact surface connectable to an earth connection common to the assembly base, such that the contact surface of each of the second components of the plurality of second components faces toward a periphery of the part of the assembly base which is to be shielded;

connecting, for each of the second components of the plurality of second components, the contact surface to the earth connection;

the plurality of first components being arranged on the assembly base such that each first component of the plurality of first components is disposed at least a first distance from the periphery of the part of the assembly base which is to be shielded, and the plurality of second components being arranged on the assembly base such that each second component of the plurality of second components is disposed at least a second distance from the periphery of the part of the assembly base which is to be shielded, the first distance being greater than the second distance; and shielding the plurality of first components with a shielding unit.

7. The method according to claim 6, wherein each second component of the plurality of second components includes a side that faces towards the periphery of the part of the assembly base which is to be shielded and the side of each second component of the plurality of second components is disposed at least a third distance from any first component of the plurality of first components.

8. The method according to claim 7, wherein the step of shielding the plurality of first components with a shielding unit includes soldering the shielding unit to the assembly base.

* * * * *